(12) United States Patent
Saadatmand et al.

(10) Patent No.: US 6,291,828 B1
(45) Date of Patent: Sep. 18, 2001

(54) GLASS-LIKE INSULATOR FOR ELECTRICALLY ISOLATING ELECTRODES FROM ION IMPLANTER HOUSING

(75) Inventors: Kourosh Saadatmand, Merrimac; David R. Swenson, Georgetown; William F. DiVergilio, Beverly; Stephen M. Quinn, Gloucester, all of MA (US); Zhimin Wan, San Jose, CA (US); Victor M. Benveniste, Gloucester, MA (US)

(73) Assignee: Axchlisrtechnologies, Inc., Beverly, MA (US)

( * ) Notice: Subject to any disclaimer, the term of this patent is extended or adjusted under 35 U.S.C. 154(b) by 0 days.

(21) Appl. No.: 09/469,068

(22) Filed: Dec. 21, 1999

(51) Int. Cl.⁷ .............................. G21K 5/10; H01J 37/08
(52) U.S. Cl. ........................................................ 250/492.21
(58) Field of Search ............................... 250/251, 492.2, 250/492.21, 288, 492.23; 315/5.41; 156/345

(56) References Cited

U.S. PATENT DOCUMENTS

| | | | |
|---|---|---|---|
| 4,801,847 | * | 1/1989 | Sakudo et al. ....................... 315/5.41 |
| 4,818,326 | * | 4/1989 | Liu et al. .............................. 156/345 |
| 4,831,270 | | 5/1989 | Weisenberger .................... 250/492.2 |
| 5,086,256 | | 2/1992 | Tokiguchi et al. .............. 315/111.81 |
| 5,693,939 | | 12/1997 | Purser ................................... 250/251 |
| 5,796,219 | | 8/1998 | Hirakimoto et al. ................ 315/500 |
| 5,959,297 | * | 9/1999 | Weinberger et al. ................ 250/288 |

* cited by examiner

*Primary Examiner*—Jack Berman
*Assistant Examiner*—Johnnie L Smith, II
(74) *Attorney, Agent, or Firm*—John A. Kastelic

(57) ABSTRACT

An electrostatic quadrupole lens assembly (60) is provided for an ion implanter (10) having an axis (86) along which an ion beam passes, comprising: (i) four electrodes (84a–84d) oriented radially outward from the axis (86), approximately 90° apart from each other, such that a first pair of electrodes (84a and 84c) oppose each other approximately 180° apart, and a second pair of electrodes (84b and 84d) also oppose each other approximately 180° apart; (ii) a housing (62) having a mounting surface (64) for mounting the assembly (60) to the implanter, the housing at least partially enclosing the four electrodes (84a–84d); (iii) a first electrical lead (104) for providing electrical power to the first pair of electrodes (84a and 84c); (iv) a second electrical lead (108) for providing electrical power to the second pair of electrodes (84b and 84d); and (v) a plurality of electrically insulating members (92) formed of a glass-like material, comprising at least a first electrically insulating member for attaching the first pair of electrodes (84a and 84c) to the housing, and at least a second electrically insulating member for attaching the second pair of electrodes (84b and 84d) to the housing. The plurality of electrically insulating members (92) are preferably comprised of quartz ($SiO_2$), or a heat resistant and chemical resistant glass material such as Pyrex®. The members (92) resist accumulation of material such as graphite sputtered off of the electrodes (84a–84d) by the ion beam, thus reducing the occurrence of high voltage breakdown and electrical current breakdown.

16 Claims, 4 Drawing Sheets

GLASS-LIKE INSULATOR FOR ELECTRICALLY ISOLATING ELECTRODES FROM ION IMPLANTER HOUSING

FIELD OF THE INVENTION

The present invention relates generally to ion implantation systems and more particularly to the use of quartz or quartz-like beamline components in an ion implanter to prevent film coating thereof and subsequent voltage breakdowns.

BACKGROUND OF THE INVENTION

Ion implantation has become the technology preferred by industry to dope semiconductors with impurities in the large-scale manufacture of integrated circuits. High-energy ion implanters are used for deep implants into a substrate. Such deep implants are required to create, for example, retrograde wells. Eaton GSD/HE and GSD/VHE ion implanters are examples of such high-energy implanters. These implanters can provide ion beams at energy levels up to 5 MeV (million electron volts). U.S. Pat. No. 4,667,111, assigned to the assignee of the present invention, Eaton Corporation, describes such a high-energy ion implanter.

Ion implanters operate at very high voltage levels. Typically, ions in the beam are accelerated and decelerated by electrodes and other components in the implanter that reside at differing voltage levels. For example, positive ions are extracted from an ion source and accelerated by electrodes having increasingly negative potentials. In a high-energy ion implanter, the ion beam accelerates as it passes through a radio frequency (RF) linear accelerator (linac). The ion beam progresses through the RF linac by passing through a series of acceleration stages (resonator modules) in which accelerating fields are produced by synchronizing the frequency of the RF voltage to the ion beam velocity.

In known RF linac resonator modules, an RF signal is coupled to a low-voltage end of an inductor coil, and an accelerating electrode is directly coupled to an opposing high-voltage end of the inductor coil. Each accelerating electrode is mounted between two grounded electrodes and separated by gaps. When the resonator module achieves a state of resonance, a sinusoidal voltage of large magnitude is provided at the location of the accelerating electrode.

The accelerating electrode and the ground electrodes on either side operate in a known "push-pull" manner to accelerate the ion beam passing therethrough, which has been "bunched" into "packets". During the negative half cycle of the RF sinusoidal electrode voltage, a positively charged ion packet is accelerated (pulled by the accelerating electrode from the upstream grounded electrode across the first gap). At the transition point in the sinusoidal cycle, wherein the electrode voltage is neutral, the packet drifts through the electrode (also referred to as a "drift tube") and is not accelerated. During the positive half cycle of the RF sinusoidal electrode voltage, positively charged ion packets are further accelerated (pushed by the accelerating electrode) toward the downstream grounded electrode across the second gap. This push-pull acceleration mechanism is repeated at subsequent resonator modules having accelerating electrodes that also oscillate at a high-voltage radio frequency, thereby further accelerating the ion beam packets by adding energy thereto.

In each of the first and second accelerating gaps, electric field lines produce radial focusing in the first gap and radial defocusing in the second gap. If the gap is operating at a phase which keeps the particles bunched in the axial direction, more often than not the electric field is increasing in magnitude, through its RF cycle, when a particle is passing through the gap. Consequently, the electric radial defocusing forces in the second gap are greater than the radial focusing forces in the first gap, resulting in a net radial defocusing as the ion beam passes through a particular resonator module.

Accordingly, to refocus the ion beam, magnetic or electrostatic quadruples are 20 positioned intermediate each of resonator modules in an RF linac. These magnetic or electrostatic quadruples include a plurality of magnets or high-voltage electrodes, respectively, through or by which the ion beam passes. In the case of an electrostatic quadrupole, the high-voltage electrodes, which operate between +20 kilovolts (KV) and −20 KV, are typically made of graphite, which is subject to sputtering when struck by the ion beam. Sputtered graphite material tends to coat the insulating standoffs (e.g., alumina ($Al_2O_3$)) that mount the high-voltage electrode to the electrically grounded quadrupole housing. If a sufficient amount of sputtered material coats the standoffs, it can lead to voltage breakdown between the electrode and the grounded housing by creating an electrical current path therebetween.

It is an object of the present invention, then, to provide ion implanter components that reduce the chance of being coated with material that can cause electrical shorts and resulting arcing. It is another object of the invention to provide such components in the form of electrical insulators that mount electrodes within the beamline. It is a further object to provide such components in the form of insulating standoffs that are used to mount electrostatic quadrupole electrodes in the linear accelerator portion of a high-energy ion implanter.

SUMMARY OF THE INVENTION

An electrostatic quadrupole lens assembly is provided for an ion implanter having an axis along which an ion beam passes, comprising: (i) four electrodes oriented radially outward from the axis, approximately 90° apart from each other, such that a first pair of electrodes oppose each other approximately 180° apart, and a second pair of electrodes also oppose each other approximately 180° apart; (ii) a housing having a mounting surface for mounting the assembly to the implanter, the housing at least partially enclosing the four electrodes; (iii) a first electrical lead for providing electrical power to the first pair of electrodes; (iv) a second electrical lead for providing electrical power to the second pair of electrodes; and (v) a plurality of electrically insulating members formed of a glass-like material, comprising at least a first electrically insulating member for attaching the first pair of electrodes to the housing, and at least a second electrically insulating member for attaching the second pair of electrodes to the housing.

The plurality of electrically insulating members are preferably comprised of quartz ($SiO_2$), or a heat resistant and chemical resistant glass material such as Pyrex®. The members resist accumulation of material such as graphite sputtered off of the electrodes by the ion beam, thus reducing the occurrence of high voltage breakdown and electrical current breakdown.

DETAILED DESCRIPTION OF A PREFERRED EMBODIMENT OF THE INVENTION

Figure 1:
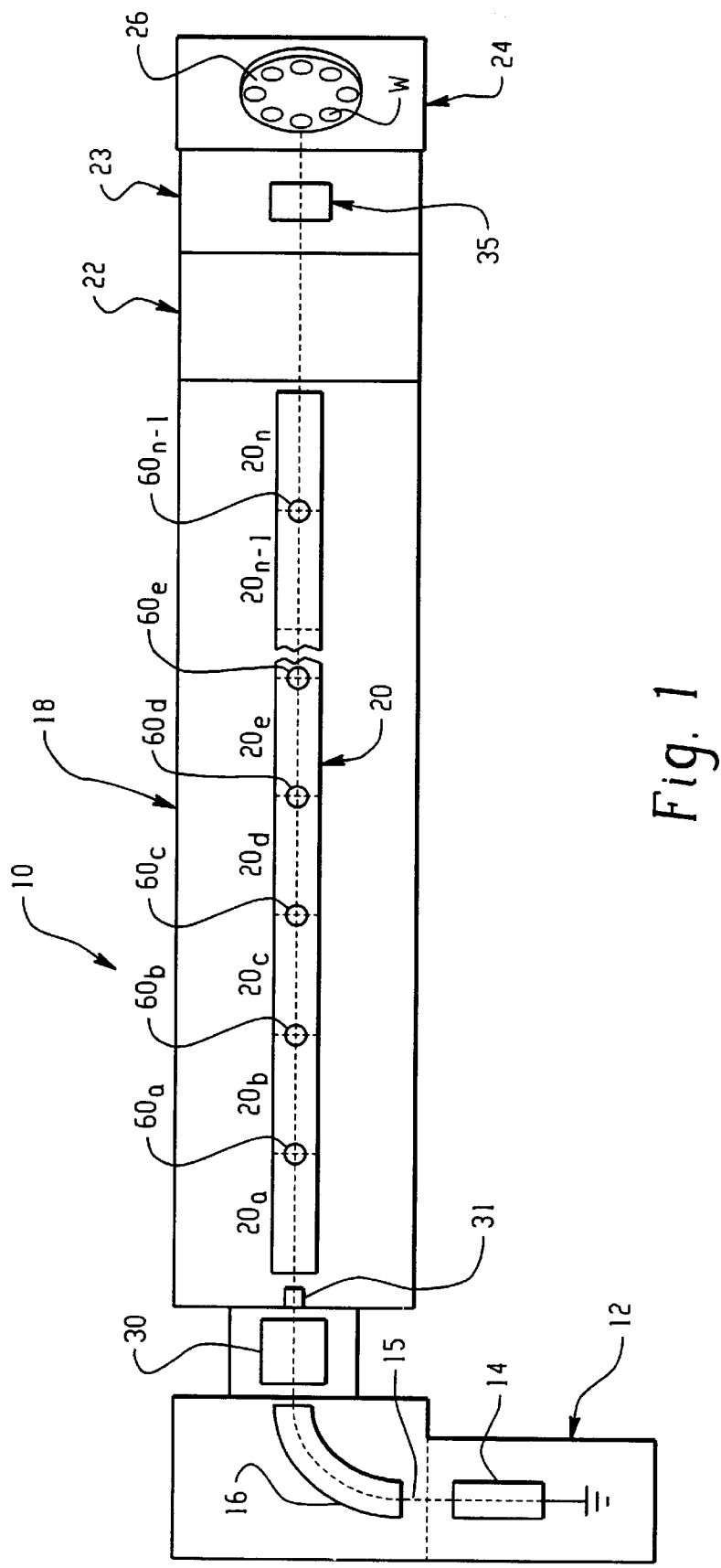
FIG. 1 is a schematic block diagram of a high-energy ion implanter into which is incorporated the present invention for reducing the occurrence of high voltage breakdown and electrical current arcing.

A cross sectional plan view of a high-energy ion implanter 10 is shown in FIG. 1. Although the invention is described herein as being incorporated into an accelerating electrode assembly in the RF linac portion of a high-energy ion implanter, it is understood that the invention may be incorporated into ion implanter components other than electrode assemblies, and in ion implanter types other than high-energy.

The implanter 10 comprises five sections or subsystems: an injector 12 including an ion source 14 for producing an ion beam 15 and a mass analysis magnet 16 for mass analyzing the ion beam; a radio frequency (RF) linear accelerator (linac) 18 including a plurality of resonator modules 20a–20n for accelerating the ion beam to a higher energy; a final energy magnet (FEM) 22 for performing final mass analysis of the accelerated ion beam; a resolver housing 23 for final resolution and conditioning of the ion beam; and an end station 24 which contains a rotating disc 26 carrying wafers W to be implanted by the ion beam.

Positioned after the mass analysis magnet 16 at the entrance to the linac 18 is a variable aperture 30 for controlling the amount of beam current passing into the linac. Immediately downstream of the aperture 30 is a first flag Faraday 31 for measuring the beam current out of the aperture 30 and into the linac 18. A second flag Faraday 35 is located in the resolver housing 23 for measuring the current of the ion beam prior to implanting into the wafer W.

The mass analysis magnet 16 functions to pass to the RF linac 18 only the ions generated by the ion source 14 having an appropriate charge-to-mass ratio. The mass analysis magnet is required because the ion source 14, in addition to generating ions of appropriate charge-to-mass ratio, also generates ions of greater or lesser charge-to-mass ratio than that desired. Ions having inappropriate charge-to-mass ratios are not suitable for implantation into the wafer.

The ion beam that passes through the mass analysis magnet 16 is typically comprised of a single isotope and enters the RF linac 18 which imparts additional energy to the ion beam passing therethrough. The RF linac produces particle accelerating fields which vary periodically with time, the phase of which may be adjusted to accommodate different atomic number particles as well as particles having different speeds. Each of the plurality of resonator modules 20 in the RF linac 18 functions to further accelerate ions beyond the energies they achieve from a previous module.

Intermediate each of the resonator modules 20 is an electrostatic quadrupole lens 60. The quadrupole lens 60 refocuses the ion beam passing therethrough, to counter the effect of net radial defocusing as the ion beam passes through a particular resonator module 20. Although not shown in FIG. 1, quadrupole lenses may also be positioned immediately before and after the RF linac 18.

Figure 2:
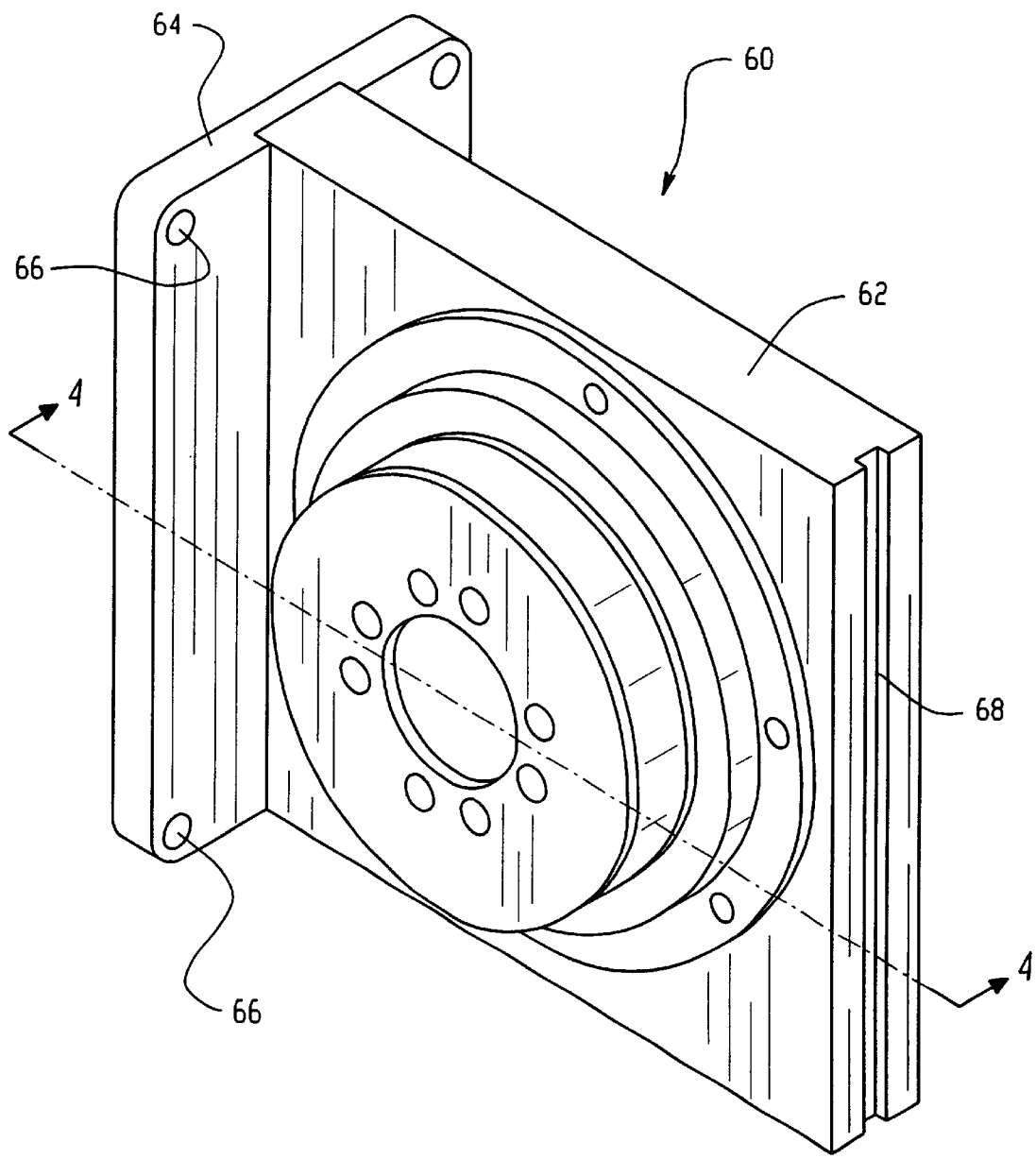
FIG. 2 a perspective view of an electrostatic quadrupole lens constructed according to the principles of the present invention, which is incorporated into the linear accelerator portion of the ion implanter of FIG. 1.

FIG. 2 shows an electrostatic quadrupole lens 60 in more detail. The lens 60 comprises a housing 62 including a mounting flange 64 provided with bolt holes 66 for mounting the lens 60 to the linac block. The housing 62 may be constructed of aluminum and may be provided with a groove 68 into which may be partially installed an RF shield device.

Figure 3:
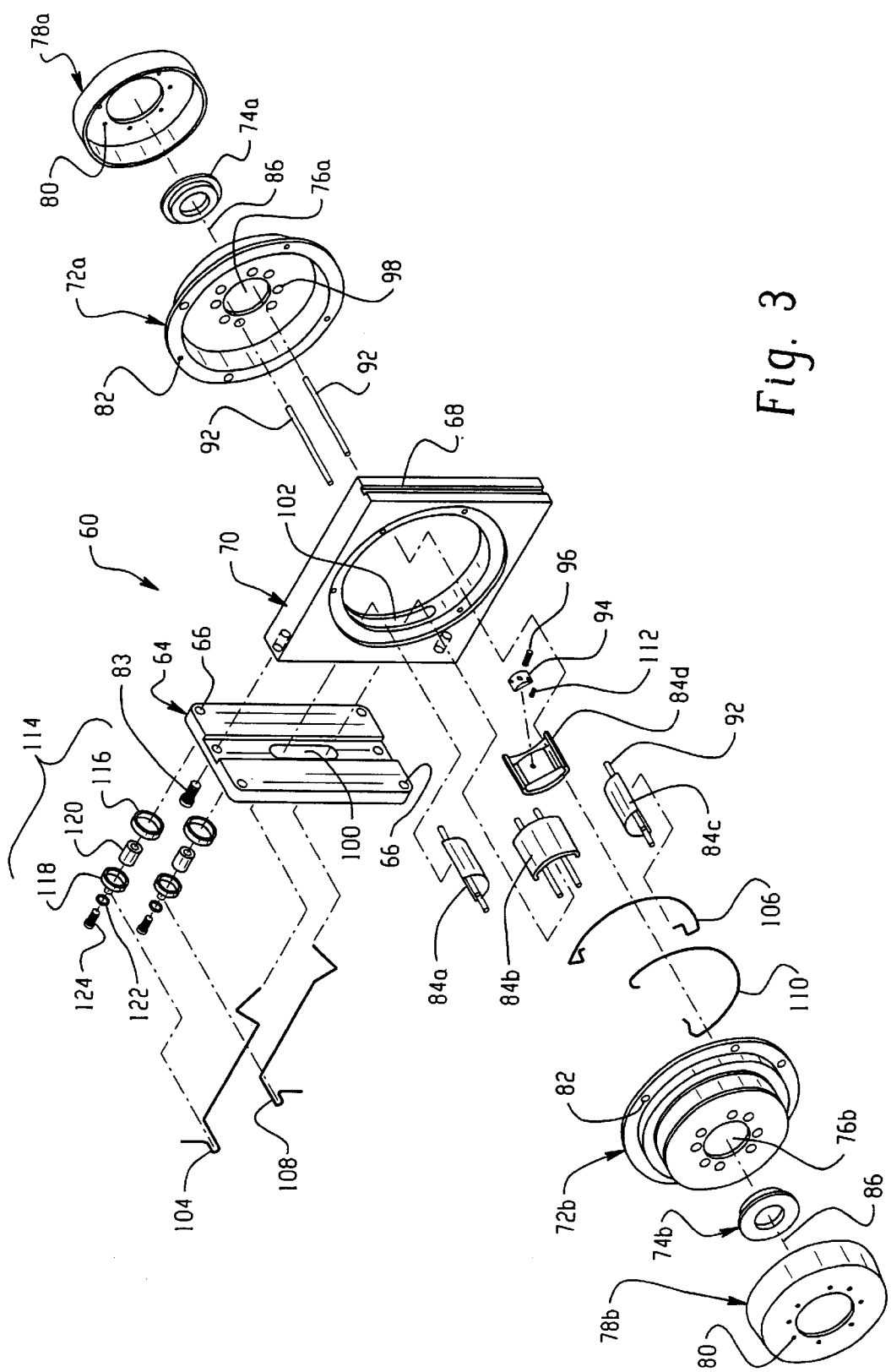
FIG. 3 is an exploded view of the electrostatic quadrupole lens of FIG. 2.

Contained within the housing 62 are the operational components of the electrostatic quadrupole lens, as better shown in the exploded view of FIG. 3.

As shown in FIG. 3, the electrostatic quadrupole lens housing 62 comprises a central housing portion 70 surrounded on either side by outer portions 72a and 72b. Annular graphite plugs 74a and 74b surround openings 76a and 76b, respectively, in the housing outer portions that permit the ion beam to pass therethrough. Endcaps 78a and 78b maintain the position of the graphite plugs 74a and 74b and complete the lens housing 62. Fasteners such as bolts or screws (not shown) are used to attach the endcaps to the housing outer portions at locations 80, and to attach the housing outer portions to the central housing portion at locations 82. The central housing portion 70 is secured to the mounting flange 64 using bolts 83 (see also FIG. 4).

Figure 4:
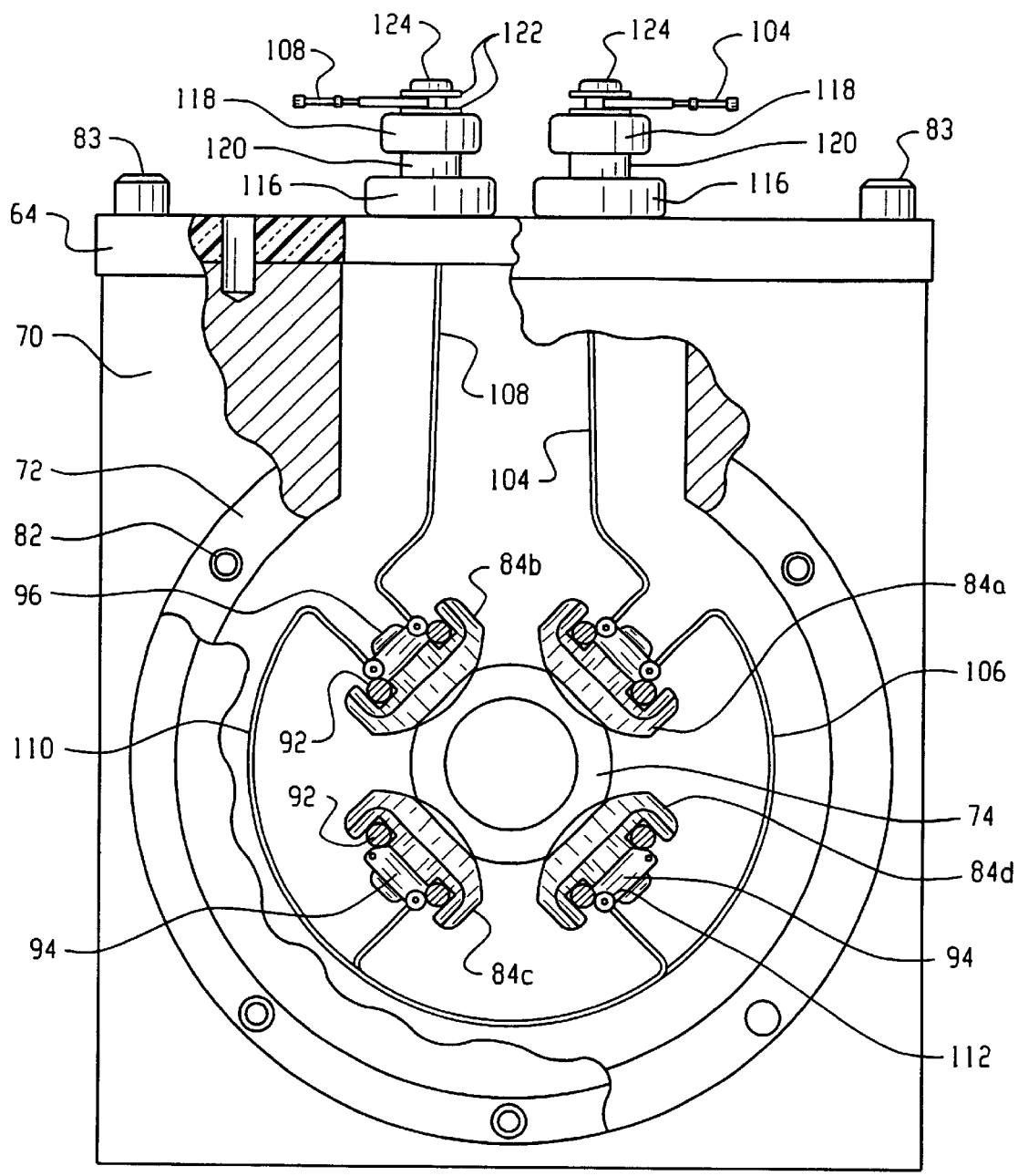
FIG. 4 is a partial cutaway view of the electrostatic quadrupole lens of FIG. 2, taken along the lines 4—4.

The lens housing 62 encloses the electrostatic quadrupole electrodes 84a through 84d which are oriented radially outward from an ion beam axis 86, approximately 90° apart from each other (see also FIG. 4). The electrodes 84 are comprised of graphite and are positioned within the lens housing by standoff rods 92. A first pair of electrodes 84a and 84c oppose each other approximately 180° apart, and a second pair of electrodes 84b and 84d also oppose each other approximately 180° apart.

A pair of standoff rods attaches to the back of each electrode 84 by means of a clamp 94 and a screw 96. As such, eight standoff rods 92 are used to position the four electrodes 84a through 84d within the lens housing 62. The ends of standoff rods 92 seat into recesses in the outer portions 72a and 72b of the lens housing. The fasteners that attach the endcaps 78 to these outer portions screw directly into the standoff rods to fix their position within the housing 62.

Electrical power is delivered to the electrodes 84 via slots 100 and 102 provided in the mounting flange 64 and central housing portion 70, respectively. Electrical lead 104 passes through these slots and attaches to electrode 84a. Jumper wire 106 connects electrode 84a to electrode 84c, such that both of these electrodes operate at the same voltage. Similarly, electrical lead 108 passes through these slots and attaches to electrode 84b. Jumper wire 110 connects electrode 84b to electrode 84d, such that both of these electrodes operate at the same voltage. Screws 112 secure the electrical leads 104 and 108 and the jumper wires 106 and 110 to the same clamps 94 that secure the standoff rods 92 to the electrodes 84.

The electrical leads which pass through the slot 100 in the mounting flange 64 are each fixedly mounted to the back of the flange by means of a terminal assembly 114. Each terminal assembly 114 comprises a lower terminal portion 116 which abuts the electrically grounded flange 64, an upper terminal portion 118 to which the electrical lead is fixedly attached, and an insulator 120 separating the upper and lower terminal portions. The insulator 120 is required because, while the flange 64 is electrically grounded, the electrical leads, and hence the electrodes to which they are attached, operate at high voltage (e.g., +20 kilovolts (KV) and −20 KV for leads 104 and 108, respectively). The electrical leads 104 and 108 are fixedly attached to the upper terminal portions 118 by washers 122 and terminal screws 124 (see also FIG. 4).

Because the electrical leads and the electrodes to which they are attached operate at high voltage, the standoff rods 92 are made of an insulating material. In the preferred embodiment the standoff rods 92 are made of quartz ($SiO_2$). Alternatively, other quartz-like insulating materials may be used, e.g., Pyrexg®, which is a trademarked name for a heat resistant and chemical resistant glass material. As used herein, glass-like materials shall mean either Pyrex® or quartz ($SiO_2$). As shown in FIG. 3, the standoff rods 92 attach at either end to the outer portions 72 of the electrically grounded lens housing 62, and support the high voltage electrodes 84a through 84d.

In one example of operation, the four electrodes 84a through 84d are energized, so that electrodes 84a and 84c are operated at a potential of +20 KV and electrodes 84b and 84d are operated at a potential of −20 KV. The four energized electrodes form a quadrupole electrical field, having quadrupole components in the region between the electrodes, to radially focus the ion beam passing therethrough.

Although the invention has been described in terms of quartz (SiO2) or Pyrex®, it is contemplated that other materials may be substituted for the standoff rods 92. Quartz, as a non-metallic oxide of silicon, is an inexpensive and abundantly available choice for the standoffs. Standoff rods 92 made of quartz function well as electrical insulators, and have outer surfaces which have been found to resist accumulation of graphite sputtered off of the electrodes 84 as the ion beam passes through the quadrupole lens 60. In this manner, the quartz rods 92 prevent a conductive graphite coating from accumulating on the surface thereof.

Accordingly, a preferred embodiment of electrode standoff rods for use in an ion implanter has been described. With the foregoing description in mind, however, it is understood that this description is made only by way of example, that the invention is not limited to the particular embodiments described herein, and that various rearrangements, modifications, and substitutions may be implemented with respect to the foregoing description without departing from the scope of the invention as defined by the following claims and their equivalents.

What is claimed is:

1. An electrode assembly (60) for an ion implanter (10), comprising:
    at least one electrode (84);
    a housing (62) having a mounting surface (64) for mounting the assembly (60) to the implanter, said housing residing at a first electrical voltage;
    at least one electrical lead (104) for providing electrical power to said at least one electrode (84), said at least one electrode residing at a second electrical voltage;
    at least one electrically insulating member (92) for attaching said at least one electrode (92) to said housing (62), said electrically insulating member comprised of a glass-like material.

2. The assembly (60) of claim 1, wherein said electrically insulating member (92) is comprised of quartz ($SiO_2$).

3. The assembly (60) of claim 1, wherein said electrically insulating member (92) is comprised of a heat resistant and chemical resistant glass material.

4. The assembly (60) of claim 3, wherein said insulating member (92) is comprised of Pyrex®.

5. The assembly (60) of claim 1, wherein said electrode assembly is a quadrupole lens through which an ion beam (15) passes during operation of the ion implanter (10), wherein said at least one electrode (84) comprises four electrodes (84a–84d), wherein said at least one electrical lead comprises a first lead (104) for electrically energizing a first pair of electrodes (84a and 84c) and a second lead 108 for electrically energizing a second pair of electrodes (84a and 84c), and wherein said at least one electrically insulating member (92) comprises at least a first member for connecting said first pair of electrodes to said housing and at least a second member for connecting said second pair of electrodes to said housing.

6. The assembly (60) of claim 5, wherein said quadrupole lens is positioned within a radio frequency (RF) linear accelerator (18) in the ion implanter 10.

7. The assembly (60) of claim 5, wherein said first pair of electrodes operates at approximately +20 kilovolts (KV) and said second pair of electrodes operates at approximately −20 KV, and said housing (62) is electrically grounded.

8. The assembly (60) of claim 5, wherein said electrodes (84a–84d) are comprised of graphite, and wherein said first and second electrically insulating members (92) comprise a plurality of electrically insulating standoffs that attach said electrodes to said housing (62).

9. The assembly (60) of claim 8, wherein said plurality of electrically insulating standoffs (92) resist accumulation of graphite sputtered off of said electrodes (84a–84d) as the ion beam passes through said quadrupole lens.

10. An electrostatic quadrupole lens assembly (60) for an ion implanter (10) having an axis (86) along which an ion beam passes, comprising:
    four electrodes (84a–84d) oriented radially outward from the axis (86), approximately 90° apart from each other, such that a first pair of electrodes (84a and 84c) oppose each other approximately 180° apart and reside at a first electrical voltage, and a second pair of electrodes (84b and 84d) also oppose each other approximately 180° apart and reside at a second electrical voltage;
    a housing (62) having a mounting surface (64) for mounting the assembly (60) to the implanter, said housing at least partially enclosing the four electrodes (84a–84d) and residing at a third electrical voltage;
    a first electrical lead (104) for providing electrical power to said first pair of electrodes (84a and 84c);
    a second electrical lead (108) for providing electrical power to said second pair of electrodes (84b and 84d); and
    a plurality of electrically insulating members (92) formed of a glass-like material, comprising at least a first electrically insulating member for attaching said first pair of electrodes (84a and 84c) to said housing, and at least a second electrically insulating member for attaching said second pair of electrodes (84b and 84d) to said housing.

11. The assembly (60) of claim 10, wherein said plurality of electrically insulating members (92) are comprised of quartz ($SiO_2$).

12. The assembly (60) of claim 10, wherein said plurality of electrically insulating members (92) are comprised of a heat resistant and chemical resistant glass material.

13. The assembly (60) of claim 12, wherein said plurality of electrically insulating members (92) are comprised of Pyrex®.

14. The assembly (60) of claim 10, wherein said first pair of electrodes operates at approximately +20 kilovolts (KV) and said second pair of electrodes operates at approximately −20 KV, and said housing (62) is electrically grounded.

15. The assembly (60) of claim 10, wherein said electrodes (84a–84d) are comprised of graphite, and wherein said plurality of electrically insulating members (92) comprises a plurality of electrically insulating standoffs that attach said electrodes to said housing (62).

16. The assembly (60) of claim 15, wherein said plurality of electrically insulating standoffs (92) resist accumulation of graphite sputtered off of said electrodes (84a–84d) as an ion beam passes through said quadrupole lens.

* * * * *